United States Patent [19]

Garfinkel et al.

[11] 4,152,595
[45] May 1, 1979

[54] CHARGE SENSING CIRCUIT

[75] Inventors: Marvin Garfinkel, Schenectady; Henry H. Woodbury, Scotia, both of N.Y.

[73] Assignee: General Electric Company, Schenectady, N.Y.

[21] Appl. No.: 846,543

[22] Filed: Oct. 28, 1977

[51] Int. Cl.² ............ H03K 5/18; G05F 1/56; H03K 1/14; G01T 1/24

[52] U.S. Cl. ............ 307/350; 250/252; 250/370; 307/200 B; 307/359; 307/297; 307/308; 323/22 R

[58] Field of Search ............ 250/252, 370; 307/200 A, 200 B, 350, 359, 362, 297, 308; 323/19, 22 R; 328/162

[56] References Cited

U.S. PATENT DOCUMENTS

| | | | |
|---|---|---|---|
| 3,970,875 | 7/1976 | Leehan | 323/22 R X |
| 3,975,648 | 8/1976 | Tobey, Jr. et al. | 323/22 R X |
| 4,007,415 | 2/1977 | Toyoda | 323/19 |
| 4,047,034 | 9/1977 | Auphan | 250/252 X |
| 4,064,448 | 12/1977 | Eatock | 307/297 X |
| 4,075,623 | 2/1978 | Futagawa et al. | 307/297 X |
| 4,078,178 | 3/1978 | Lowes | 250/252 X |

OTHER PUBLICATIONS

*Electronics*, pp. 96-100, 2/3/1977.

*Primary Examiner*—Larry N. Anagnos
*Attorney, Agent, or Firm*—Julius J. Zaskalicky; Joseph T. Cohen; Marvin Snyder

[57] ABSTRACT

In connection with a charge sensing device having a P-N junction and which develops background charge as well as signal charge in the operation thereof, a circuit is provided for reversely biasing the P-N junction and maintaining substantially constant voltage across the P-N junction to balance the background charge developed while sensing signal charge collected by the P-N junction and developing an output proportional to the collected signal charge.

9 Claims, 4 Drawing Figures

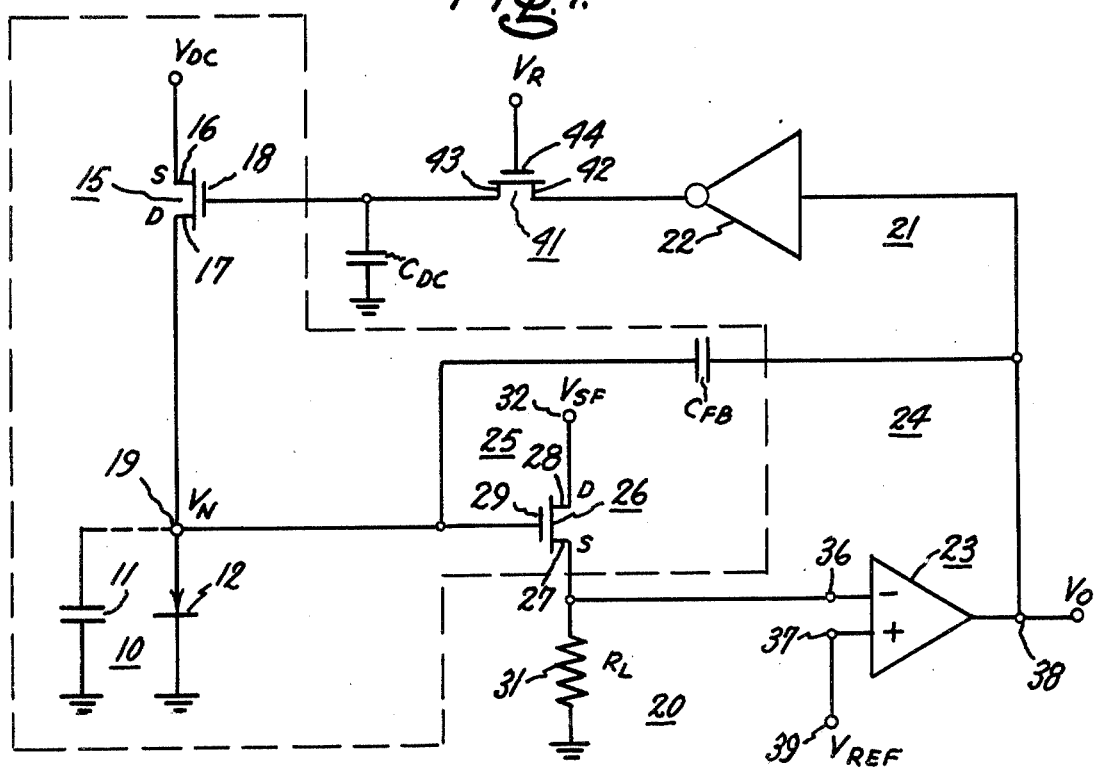
Fig. 1.
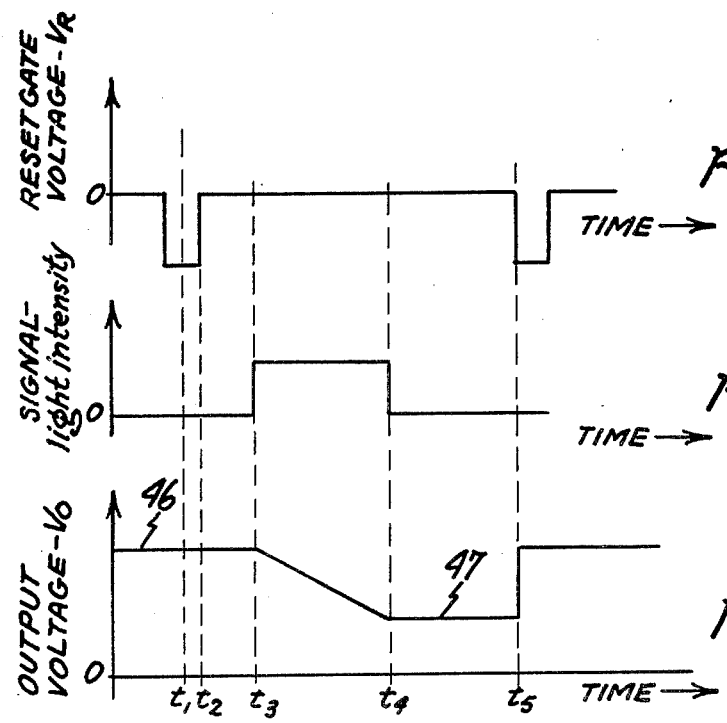
Fig. 2A.
Fig. 2B.
Fig. 2C.

CHARGE SENSING CIRCUIT

The present invention relates in general to a charge sensing circuit for energizing the electrodes of charge sensing devices and sensing the flow of charge therein, and relates in particular to sensing the charge flow in such devices which includes a leakage or background component in addition to a signal induced component.

An object of the present invention is to provide circuit means for sensing signal charge induced in a charge sensing device while compensating for leakage current flow in the device.

Another object of the present invention is to provide a circuit for use with charge sensing devices which has high sensitivity, high linearity, and has high speed of response.

A further object of the present invention is to provide a circuit which has the capability of measuring small time varying charge flows in the presence of large steady charge flow.

In carrying out the present invention in an illustrative embodiment thereof, as applied to a charge sensing device including a substrate of one conductivity type and a region of the opposite conductivity type located therein forming a P-N junction, there is provided means for reversely biasing the P-N junction including a source of voltage and a first transistor having a source, a drain, and a gate. The P-N junction and the source to drain conduction path of the transistor are connected in series circuit with the source of voltage. Means are provided for establishing a substantially constant voltage on the region of opposite conductivity type and thereby producing a substantially zero rate of charge accumulation in the region of opposite conductivity type which includes a high gain differential amplifier having a non-inverting input terminal, an inverting input terminal, and an output terminal. The voltage at the output terminal of the differential amplifier is responsive to the difference in voltage at the input terminals thereof. The non-inverting terminal is provided with a reference potential. The inverting terminal is connected to the region of opposite conductivity type, and the output terminal is connected through a first feedback path including a switch to the gate of the transistor. A capacitance is connected between the gate and the substrate of the device. Thus, a substantially constant voltage is established on the region of opposite conductivity type and is maintained thereon when the output terminal of the differential amplifier is disconnected from the gate of the first transistor by the switch. Means are provided for sensing a change in the rate of charge flow to the region of opposite conductivity type corresponding to a signal applied to the charge sensing device which include a second feedback path having a second capacitance connected between the output terminal and the region of opposite conductivity type. Thus, the potential on the region of opposite conductivity type remains substantially constant and an output voltage is produced at the output terminal of the differential amplifier which is proportional to the applied signal.

The novel features which are believed to be characteristic of the present invention are set forth with particularity in the appended claims. The invention itself, both as to its organization and method of operation, together with further objects and advantages thereof may best be understood by reference to the following description taken in connection with the accompanying drawings wherein:

FIG. 1 shows a schematic diagram of a circuit in accordance with the present invention.

FIG. 2 shown waveforms useful in explaining one mode of operation of the circuit of FIG. 1.

Reference is now made to FIG. 1 which shows an embodiment of the circuit of the present invention as applied to the sensing or detection of charge in a device such as device 10, shown and described in connection with FIGS. 1, 2 and 3 of U.S. Pat. No. 4,101,924 assigned to the assignee of the present invention, and which is incorporated herein by reference thereto. In FIG. 1 of the present application the device 10 is represented by an MOS (metal-oxide-semiconductor) capacitance 11 and a semiconductor diode 12 formed on a common substrate in which charges generated in the MOS capacitor 11 are coupled along the surface of the substrate into the semiconductor diode 12. In such devices not only is charge generated in response to a signal, for example, a burst of light, but also background charge is developed or generated by other causes such as thermal, the latter charge being developed substantially continuously whether signal is present or not. Accordingly, in order to detect the signal generated charge it is necessary to compensate for the background charge. The present invention is directed to the provision of a circuit which enables automatic compensation of background current or leakage current while enabling signal induced charge to be detected. In the circuit of FIG. 1 the detector 10 is formed on an N-type substrate, thus the cathode of the diode is N-type conductivity and the anode is a region of P-type conductivity. The charge collected in the depletion region of the MOS capacitance 11 is in the form of holes which are minority carriers in the N-type substrate and become majority carriers when collected in the P-type region of the diode 12. Bias for operation of the diode and background current compensation thereof is provided by background current compensation circuit including an N-channel transistor 15 having a source 16, a drain 17, and a gate 18 and a voltage supply (not shown) providing bias voltage $V_{DC}$. The source 16 of transistor 15 is connected to the negative terminal of the voltage supply, the positive terminal of which is connected to the substrate. The drain 17 is connected to the anode of the diode 12. Thus, the transistor 15 and the diode 12 are connected in series across the voltage supply providing voltage $V_{DC}$ with the substrate being connected to ground. The current flow through the transistor 15 and the diode 12, including the background current flowing thereto through the substrate from the MOS capacitance 11, is controlled by the voltage setting on the gate electrode 18. The compensation of the background current flow through the photodetector device is accomplished by setting the voltage at the anode thereof, also referred to as node 19, by an amplifier channel 20 having the input thereof connected to the node 19 and having a feedback loop 21 connecting the output thereof to the gate electrode 18 of the current control transistor 15. The amplifier channel 20 comprises a source follower stage 25 including a transistor 26 having a source 27, a drain 28, and a gate 29. The source 27 is connected through a load resistor 31 having a value of resistance $R_L$ to ground. The drain 28 is connected to a terminal 32 to which a voltage $V_{SF}$ is applied from a voltage supply (not shown). The gate 29 of the transistor is connected to the signal node 19. The differential amplifier 23 has an inverting input terminal 36, a non-inverting input terminal 37 and an output terminal 38. The differential amplifier may be any of a variety of high gain operational amplifiers commercially available, for example, operational amplifier LF356 available from National Semiconductor Company of Santa Clara, Calif. The inverting input terminal 36 is connected to the source 27 of transistor 26. The non-inverting terminal 37 is connected to a terminal 39 to which a D-C reference potential $V_{REF}$ is applied from a source (not shown). The feedback loop 21 includes an inverter 22, a transistor switch 41 having a source 42, a drain 43, and a gate 44, and a first capacitor $C_{DC}$. The output terminal 38 is connected to the input of inverter 22, the output of which is connected to the source 42. The drain 43 is connected to the gate 18 of transistor 15. The capacitor $C_{DC}$ is connected between the gate 18 and ground.

The manner in which the differential amplifier channel 20 with the first feedback loop 21 including inverter 22, transistor switch 41, and the first capacitor $C_{DC}$ operates in conjunction with the transistor 15 to provide and maintain a substantially constant voltage at the node 19 will now be described. The voltage $V_N$ appearing at node 19 will be applied with some voltage drop through the source follower 25 to the inverting terminal 36 of the differential amplifier 23. If this voltage is greater than the voltage on the non-inverting terminal 37, a voltage will appear at the output terminal 38 of one polarity. If the voltage appearing on the inverting terminal 36 is less than the voltage appearing on the non-inverting terminal 37, a voltage of the opposite polarity will appear on the output terminal 38. A suitable voltage is applied to the gate of transistor 41 to turn the transistor switch 41 on. The voltage appearing on the output terminal 38 is inverted by inverter 22 and is applied to the gate of the transistor 15. A voltage change in one direction will cause current flow to increase through the transistor 15 and a voltage change in the opposite direction will cause current flow to decrease through the transistor 15. Thus, by virtue of the feedback loop 21 the voltage at the node 19 will stabilize at a fixed value related by a fixed potential difference to the voltage $V_{REF}$ on the non-inverting terminal 37. This stabilized voltage on node 19 corresponds to the value of voltage at which relatively constant leakage current flow in the device 10 plus any relatively constant current flow induced by external means such as the steady intensity component of a light signal directed on the device 10 are balanced by current flow from the supply of the voltage $V_{DC}$.

Several sources or supplies provide voltages for the operation of the circuit. A first source supplies $V_{DC}$ which is used for setting the voltage on transistor 15 and provides background current to the diode 12. A second source supplies a voltage $V_{SF}$ for the source follower 25. A third source supplies a voltage for providing reference potential $V_{REF}$ to the non-inverting terminal 37 of the differential amplifier 23. Voltage $V_{DC}$ must be larger in absolute magnitude than the voltage desired at node 19. Voltage $V_{SF}$ must be larger in absolute magnitude than voltage $V_{REF}$.

A second feedback loop 24 consisting of a feedback capacitor $C_{FB}$ is provided from the output 38 of the differential amplifier 23 to the input node 19. The manner in which the differential amplifier 23 and associated circuitry enables a constant voltage to be applied to the P-type region of the diode 12 and the signal node 19 and the manner in which signal charge flow to the P-type region of the diode 12 is sensed will now be explained. For the high gain differential amplifier 23 with capacitive feedback from the output terminal 38 to the input terminal 36 thereof through the source follower stage 25, the ratio of the incremental change in the output voltage $\Delta V_O$ to the incremental change in charge $\Delta Q_N$ delivered to the node 19 is $$\Delta V_O = \frac{\Delta Q_N}{C_{FB}}. \tag{1}$$

Thus, any charge delivered to the input node 19 produces a voltage change at the output terminal 38 which is equal to the charge delivered divided by the feedback capacitance $C_{FB}$.

The manner in which the circuit of the present invention operates will now be explained in connection with FIGS. 2A, 2B, and 2C. The waveform of FIG. 2A represents the voltage $V_R$ applied to the gate 44 of the transistor 41 to cause a periodic closing and opening of the first feedback loop 21. The waveform of FIG. 2B represents a signal in the form of a pulse of radiation applied to the detector which causes minority charges to be developed in the detector and to flow to the signal node 19 thereof. The waveform of FIG. 2C represents the signal $V_O$ appearing at the output of the differential amplifier 23 in response to the reset voltage $V_R$ of FIG. 2A and to the signal of FIG. 2B. At time $t_1$ with the transistor switch 41 closed and no signal applied to the detector 10, a fixed voltage is established at the signal node 19 due to the stabilizing action of the first feedback loop 21 to produce a voltage which is fixed in relation to the voltage $V_{REF}$. Accordingly, the voltage at the output of the differential amplifier 23 is represented by a value 46 on the output waveform of FIG. 2C. At time $t_2$ the voltage applied to the transfer switch 41 is raised turning off the switch. As the voltage on the gate 18 of transistor 15 remains fixed due to capacitor $C_{DC}$, no change in voltage appears at the node 19 resulting from leakage current or background current flow which remains substantially constant. (It is assumed that over a short period of time the leakage current does not change.) At time $t_3$ signal is applied to the photodetector in the form of a pulse of radiation of FIG. 2B which causes minority carrier charge to be developed in the detector 10 and flow to the node 19. This voltage is applied through the source follower stage 25 to the inverting terminal 36 of the differential amplifier 23. The charge flowing into the P-type region of the diode 12 i.e. appearing on signal node 19, causes a rise in the potential thereof toward ground thereby causing the potential on the inverting terminal 36 to become more positive than the voltage $V_{REF}$ on terminal 37. The change in potential on the inverting terminal 36 in the positive direction causes an output to be produced at output terminal 38 which is opposite, that is, in the negative direction. The feedback capacitor $C_{FB}$ functions to drive the signal node 19 and hence the inverting terminal 36 in the opposite direction, that is, in the negative direction, to maintain zero difference in voltage between potential on the inverting terminal and the potential on the non-inverting terminal 37. As pointed out above, the change in output voltage resulting from the charge flowing to the signal node is equal to the charge delivered to the input node divided by the feedback capacitance $C_{FB}$. The change in voltage at the output terminal 38 in response to the pulse of input signal applied to the detector is shown in FIG. 2C as level 47 at time t₄. At a point in time between t₄ and t₅, the voltage level appearing at terminal 38 of the differential amplifier is sampled and is compared with the voltage sampled at the output terminal 38 and appearing in the time interval between t₂ and t₃ to obtain a net voltage representing the integrated value of charge carriers which flow into the signal node 19 in the interval t₃-t₄ in response to the applied signal. At time t₅ a second reset pulse is applied to transistor switch 41. While the light signal shown in FIG. 2B is a constant light signal, the circuit will integrate the charge flow whatever the waveform thereof.

If the time constant of the first feedback loop 21 is comparable to the period of repetition of the signal pulses of FIG. 2B, the differential amplifier with the first feedback loop does not have sufficient time to provide a fixed voltage at the node 19. This time constant may be reduced by adding an additional transistor reset switch connected between the output terminal 38 and the signal node 19. The transistor switch 41 and the additional transistor switch would be operated in parallel enabling the feedback capacitor $C_{FB}$ to be rapidly discharged and the output voltage $V_O$ returned to zero reference in preparation for the succeeding cycle of charge sensing.

In another mode of operation the transistor switch 41 would be eliminated and a resistance (not shown) $R_{DC}$ substituted therefor. In this circuit the time constant of the first feedback loop 21, essentially the time constant of the capacitor $C_{DC}$ and the resistance $R_{DC}$, would be made substantially larger than the period of repetition of the signal pulses of FIG. 2B. In the operation of this circuit, an average voltage would be established at the gate 18 of the transistor 15 represented by the average value of the output at terminal 38. This would produce a value of fixed voltage at the node 19 corresponding to the average value of the output at terminal 38. During the occurrence of signal pulses, the output at terminal 38 would increase above the average value thereof, reach a peak and then decay thereby producing a series of output pulses. The base level and the peak level of the pulses may be sampled to obtain a measure of the net output and hence an indication of the magnitude of the applied signal. Thus, an important aspect of the present invention is the provision of a time constant in the first feedback loop substantially longer than the time constant in the second feedback loop.

The output capacitance of the radiation sensing device 10 of U.S. Pat. No. 4,101,924 is quite small and the signals appearing thereon are also quite small even though the voltage is augmented or enhanced by the utilization of small capacitance. The connection of external charge sensing devices would load the output capacitance and destroy the usefulness of the device. Accordingly, it is desirable that the elements of the charge sensing circuit connected to the node 19 be incorporated on the same substrate as the device 10. To this end, the circuit components enclosed in the dotted box of FIG. 1 are incorporated on the same substrate. This would include the transistor 15, the transistor 26, and the capacitance $C_{FB}$. If desired, the entire circuit could be located on chip.

For the proper operation of the circuit, it is important that leakage from the node 19 be kept to a minimum to provide high sensitivity. To this end, leakage between the drain 17 and the substrate should be kept low. The capacitor $C_{FB}$ should be of high quality to provide linear output voltage.

A particular advantage of the circuit of the present invention is that the signal node 19 operates at a substantially constant voltage. Thus, even though the detector device 10 is a non-linear device, linear outputs are obtained. Also, linearity of response is not dependent on linearity of the high gain differential amplifier. Another advantage of the circuit is that when all of the critical circuit elements are located on the same substrate they have low capacitance and hence, do not degrade the performance of the detector in the detection of charges. The circuit provides automatic compensation of background currents enabling small signal currents to be detected in the presence of very large background currents. The linearity of the circuit depends only on the quality of the feedback capacitance $C_{FB}$. The gain of the amplifier 23 is of no consequence except that it should be very high.

While the circuit of invention has been described in connection with a detector device formed on an N-type conductivity substrate, and while the circuit has been described as formed on an N-type conductivity substrate, P-type conductivity substrates could as well be used. Of course, in such a case N-channel transistors would be used in place of P-channel transistors and vice-versa, and the operating voltages would be reversed in polarity.

While in the circuit of FIG. 1, transistor 15 is shown and described as an insulated gate field effect transistor, other types of transistors, for example a junction field effect transistor, may be used for transistor 15.

While the charge sensing circuit of FIG. 1 with capacitance $C_{FB}$ in the second feedback path operates in a charge integrating mode, it will be understood that the circuit of the invention may be operated in an instantaneous mode in which the output is an amplified replica of the input. To this end, a resistance would be substituted for the capacitance $C_{FB}$.

While the circuit of the present invention has been illustrated in connection with a particular photodetector, namely the photodetector of aforementioned patent application, Ser. No. 807,080, it is equally applicable to other detectors, for example, simple diodes which are reversely biased and are responsive to radiation.

While the invention has been described in specific embodiments, it will be understood that modifications may be made by those skilled in the art, and it is intended by the appended claims to cover all such modifications and changes as fall within the true spirit and scope of the invention.

What we claim as new and desire to secure by Letters Patent of the United States is:

1. In combination,
   a charge sensing device including a substrate of one conductivity type and a region of opposite conductivity type located therein forming a P-N junction,
   means for reversely biasing said P-N junction including a source of voltage and a first transistor including a control electrode and a pair of output electrodes, said P-N junction and the output electrodes of said first transistor connected in series circuit with said source of voltage,
   means for establishing and maintaining a substantially constant voltage with respect to said substrate on said region of opposite conductivity type and thereby producing a substantially zero rate of charge accumulation in said region of opposite conductivity type including a high gain differential amplifier having a non-inverting input terminal, an inverting input terminal, and an output terminal, the voltage at said output terminal being responsive to the difference in voltage at said input terminals, said non-inverting terminal being provided with a reference potential, said inverting terminal being connected to said region of opposite conductivity type, said output terminal being connected through a first feedback path to the control electrode of said first transistor, a capacitor connected between said control electrode and said substrate, means for sensing a change in the rate of charge flow to said region of opposite conductivity type corresponding to a signal applied to said charge sensing device which includes a second feedback path having an impedance connected between said output terminal and said region of opposite conductivity type, whereby the potential on said region of opposite conductivity type remains substantially constant and an output voltage which is proportional to said signal is produced at said output terminal.

2. The combination of claim 1 in which the time constant of said second feedback path is substantially shorter than the time constant of said first feedback path.

3. The combination of claim 2 in which said impedance is a capacitance.

4. The combination of claim 3 in which said first feedback path includes a switch connected between said control electrode of said first transistor and said output terminal of said differential amplifier, and in which are provided means for closing said switch to establish said substantially constant voltage on said region of opposite conductivity type and means for opening said switch to enable sensing said signal at said output terminal.

5. The combination of claim 4 in which said switch is a second transistor having a source, a drain, and a gate, said first feedback path including the source-to-drain conduction path of said second transistor.

6. The combination of claim 3 in which the connection of said region of opposite conductivity type to said inverting terminal includes a second transistor having a source, a drain, and a gate connected as a source follower stage, said gate of said second transistor being connected to said region of opposite conductivity type and said source of said second transistor being connected to said inverting terminal.

7. The combination of claim 6 in which said charge sensing device, and said first and second transistors and said feedback capacitor are formed on a common substrate.

8. The combination of claim 1 in which said first transistor is an insulated gate field effect transistor having a source, a drain, and a gate, said P-N junction and the source-to-drain conduction path of said first transistor being connected in series circuit with said source of voltage, said gate of said first transistor being connected to said output terminal.

9. The combination of claim 8 in which the source and drain of said first transistor are of said one type conductivity and the source of said first transistor is directly connected to said first source of voltage, and in which an inverter is provided in said first feedback path to invert the polarity of voltage at said output terminal applied to the gate of said first transistor.

* * * * *